(12) United States Patent
Wang (10) Patent No.: US 11,866,628 B2
(45) Date of Patent: Jan. 9, 2024

(54) LIGAND MODIFIED QUANTUM DOT MATERIAL AND PATTERNING THEREOF, AND QUANTUM DOT MATERIAL FOR LIGHT EMITTING AND DISPLAY DEVICES

(71) Applicant: BOE Technology Group Co., Ltd., Beijing (CN)

(72) Inventor: Haowei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 360 days.

(21) Appl. No.: 17/227,466

(22) Filed: Apr. 12, 2021

(65) Prior Publication Data

US 2022/0127525 A1    Apr. 28, 2022

(30) Foreign Application Priority Data

Oct. 28, 2020 (CN) .......................... 202011173939.X (51) Int. Cl.
*C09K 11/06* (2006.01)
*H10K 85/30* (2023.01)
(Continued)

(52) U.S. Cl.
CPC ............ *C09K 11/06* (2013.01); *H10K 85/326* (2023.02); *H10K 85/331* (2023.02);
(Continued)

(58) Field of Classification Search
CPC ............ C09K 11/06; C09K 2211/1077; C09K 2211/187; C09K 2211/188; C09K 11/025;
(Continued)

(56) References Cited

U.S. PATENT DOCUMENTS

2021/0388259 A1    12/2021    Mei et al.

FOREIGN PATENT DOCUMENTS

| CN | 110590549 | A1 | 12/2019 | |
|---|---|---|---|---|
| CN | 111900269 | A1 | 11/2020 | |
| WO | WO-2019015345 | A1 * | 1/2019 | ........... C09D 11/037 |

OTHER PUBLICATIONS

Chinese Office Action dated Feb. 11, 2022 related Chinese Application No. 202011173939.X.

\* cited by examiner

*Primary Examiner* — Ermias T Woldegeorgis
(74) *Attorney, Agent, or Firm* — ArentFox Schiff LLP; Michael Fainberg (57) ABSTRACT

Disclosed are a quantum dot material, a method for patterning a quantum dot film and a quantum dot light emitting device. when preparing a patterned quantum dot film, firstly, a quantum dot film is made by using the quantum dot material with the photolysis group, and a corresponding region of the quantum dot film is irradiated with ultraviolet light under the shielding of a mask template, so that the photolysis group in the corresponding region is photolyzed into the polarity change group, thereby changing the solubility of the quantum dot material in the corresponding region; and subsequently, the quantum dot film is cleaned by using a solvent which can dissolve the quantum dot material with the photolysis group, the quantum dot material in non-irradiated regions is dissolved and removed, and the quantum dot material in the corresponding region is retained to form a pattern of the quantum dot film.

16 Claims, 5 Drawing Sheets

(51) Int. Cl.
*H10K 50/115* (2023.01)
*H10K 50/125* (2023.01)

(52) U.S. Cl.
CPC ......... *H10K 85/361* (2023.02); *H10K 85/371* (2023.02); *H10K 85/381* (2023.02); *C09K 2211/1077* (2013.01); *C09K 2211/187* (2013.01); *C09K 2211/188* (2013.01); *H10K 50/115* (2023.02); *H10K 50/125* (2023.02)

(58) Field of Classification Search
CPC .... C09K 11/02; C09K 11/883; H10K 85/326; H10K 85/331; H10K 85/361; H10K 85/371; H10K 85/381; H10K 50/115; H10K 50/125; H10K 59/35; H10K 71/12; H10K 71/233
See application file for complete search history.

LIGAND MODIFIED QUANTUM DOT MATERIAL AND PATTERNING THEREOF, AND QUANTUM DOT MATERIAL FOR LIGHT EMITTING AND DISPLAY DEVICES

CROSS REFERENCE TO RELATED APPLICATIONS

The present disclosure claims priority to Chinese Patent Application No. 202011173939.X filed with the China National Intellectual Property Administration on Oct. 28, 2020, the entire contents of which are incorporated herein by its reference.

FIELD

The present disclosure relates to the field of display technology, in particular to a quantum dot material, a method for patterning a quantum dot film and a quantum dot light emitting device.

BACKGROUND

Semiconductor quantum dots are a kind of important fluorescent nanomaterial. The application of quantum dots to the fields of flat panel lighting and photoelectric display as a luminescent layer material has attracted more and more attention from academia and industry. Up to now, in terms of device performance, the external quantum efficiency (EQE) of quantum dot light emitting diodes (QLED) has reached 20% or more. The patterning of quantum dot luminescent layers is a key step to obtain full-color and high-resolution QLED devices. Currently, the patterning of quantum dots is realized through transfer printing, ink-jet printing, photolithography, etc.

SUMMARY

The embodiments of the present disclosure provide a quantum dot material, a method for patterning a quantum dot film, a quantum dot light emitting device and a display device.

On one aspect, the embodiments of the present disclosure provide a quantum dot material, including quantum dots and ligands linked with each of the quantum dots; wherein each of the ligand includes a coordination group binding with the quantum dot and a photolysis group linked with the coordination group, the photolysis group is photolyzed under the irradiation of ultraviolet light to generate a polarity change group, and a polarity of the polarity change group is different from a polarity of the photolysis group.

In the quantum dot material provided by the embodiments of the present disclosure, the photolysis group is an oil-soluble group, and the polarity change group is a water-soluble group; or the photolysis group is an water-soluble group, and the polarity change group is an oil-soluble group.

In the quantum dot material provided by the embodiments of the present disclosure, the oil-soluble group includes at least one of the following: a carbon-oxygen double bond group, a carbon-carbon double bond group, a carbon-nitrogen double bond group and a double electron donating group.

In the quantum dot material provided by the embodiments of the present disclosure, the double electron donating group includes at least one of dimethoxy and di-secondary amino.

In the quantum dot material provided by the embodiments of the present disclosure, the ligand further includes a quenching group linked with the photolysis group.

In the quantum dot material provided by the embodiments of the present disclosure, the quenching group includes at least one of the following: CL, Br, I, $NHCOCH_3$, $NO_2$, COOH, graphene oxide, a heavy metal chelate, CSN, gold nanoparticles, cobalt complex organic matter, manganese complex organic matter and a nickel complex organic compound.

In the quantum dot material provided by the embodiments of the present disclosure, the coordination group includes at least one of the following: amino, polyamino, hydroxyl, polyhydroxyl, sulfhydryl, polysulfhydryl, thioether, polythioether, phosphine and phosphine oxide.

In the quantum dot material provided by the embodiments of the present disclosure, the quantum dot is an inorganic quantum dot.

In the quantum dot material provided by the embodiments of the present disclosure, the inorganic quantum dot is made of one or more of the following nano-scale materials: CdS, CdSe, CdTe, ZnSe, InP, PbS, CuInS2, ZnO, $CsPbCl3$, $CsPbBr3$, $CsPbI3$, CdS/ZnS, CdSe/ZnS, ZnSe, InP/ZnS, PbS/ZnS, InAs, InGaAs, InGaN, GaN, ZnTe, Si, Ge, C.

On another aspect, the embodiments of the present disclosure also provide a method for patterning a quantum dot film, including:

making a quantum dot solution with the quantum dot material provided by the above embodiments of the present disclosure and a solvent;
 forming a quantum dot film by spin-coating the quantum dot solution on a base substrate;
 shielding a first region of the quantum dot film with a mask template;
 generating a polarity change group by irradiating a second region of the quantum dot film with ultraviolet light to cause that photolysis groups of ligands in a quantum dot material in the second region is photolyzed; wherein the second region is an region of the quantum dot film not shielded by the mask template; and
 forming a pattern of the quantum dot film by cleaning the quantum dot film with a solvent with a same polarity as the quantum dot solution.

In the above method provided by the embodiments of the present disclosure, the making the quantum dot solution with the quantum dot material provided by the above embodiments of the present disclosure and the solvent includes:

preparing the quantum dots and the ligands respectively;
 preparing a first solution by using the quantum dots and the solvent, and preparing a second solution by using the ligand and the solvent; and
 injecting the second solution into the first solution for reacting for a set period of time, and cleaning to obtain the quantum dot solution.

In the above method provided by the embodiments of the present disclosure, a wavelength of the ultraviolet light is 365 nm or 436 nm, and a light intensity of the ultraviolet light is 10 $mJ/cm^2$ to 200 $mJ/cm^2$.

In the above method provided by the embodiments of the present disclosure, the cleaning the quantum dot film with the solvent with the same polarity as the quantum dot solution includes: cleaning the quantum dot film with a solvent that is the same with the solvent in the quantum dot solution.

On yet another aspect, the embodiments of the present disclosure also provide a quantum dot light emitting device, including: a cathode, an electron transport layer, a luminescent layer, a hole transport layer and an anode which are stacked sequentially; the luminescent layer includes a plurality of monochromatic quantum dot films; and each of the quantum dot films is made by the method provided by the above embodiments of the present disclosure.

In the above quantum dot light emitting device provided by the embodiments of the present disclosure, the cathode is between the electron transport layer and a substrate; or the anode is between the hole transport layer and a substrate.

On still another aspect, the embodiments of the present disclosure also provide a display device, including the quantum dot light emitting device provided by the above embodiments of the present disclosure.

DETAILED DESCRIPTION OF THE EMBODIMENTS

In actual industrial production, the patterning of quantum dot materials is usually realized by photolithography. Photolithography is realized with the photoresists. There are positive photoresists and negative photoresists. The photoresist process has the following problems in application: the negative photoresists are low in cost, but para-xylene often serves as a developer, and organic solvents containing benzene are toxic, which is not conducive to environmental protection; the positive photoresists are high in contrast ratio, which leads to high-resolution patterns, and an alkaline aqueous solution serves as the developer, which is beneficial to environmental protection; however, the alkaline aqueous solution may destroy quantum dots in a luminescent layer.

Specifically, the patterning of quantum dots using the "lift-off" process based on the positive photoresists mainly follows the technical route of "deposition of the positive photoresists-exposure of a mask template in a target region-development-deposition of quantum dots-full exposure-development-introduction of a patterned quantum dot layer to the target region". To prepare a full-color (red, green and blue) QLED device, the above steps need to be repeated for three times. The development of the photoresists mainly relies on the alkaline aqueous solution (such as ammonia water solution or tetramethylammonium hydroxide aqueous solution). The alkaline aqueous solution may seriously damage a surface ligand state of the quantum dots, which is manifested in the fact that hydroxide ions in the alkaline aqueous solution may destroy the coordination between a surface ligand and a nanocrystal dangling bond, thus re-exposing the surface defect sites of the quantum dots, and finally destroying the luminescent layer and reducing the device efficiency. Therefore, developing a more friendly developing process or a more environment-friendly patterning process to prepare high-resolution full-color QLEDs has become the key and difficult points of research of the quantum dot display technology.

In view of this, the use of photoresists can be avoided in a quantum dot material provided by the embodiments of the present disclosure, and a direct method for patterning a quantum dot film is provided for preparing a full-color and high-resolution quantum dot light emitting device and a display device.

In order to make the object, technical solution and advantages of the present disclosure clearer, the present disclosure will be described in further detail below with reference to the accompanying drawings. Obviously, the described embodiments are only a part of the embodiments of the present disclosure, not all of the embodiments. Based on the embodiments of the present disclosure, all other embodiments obtained by those skilled in the art without creative labor are within the scope of the present disclosure.

Figure 1:
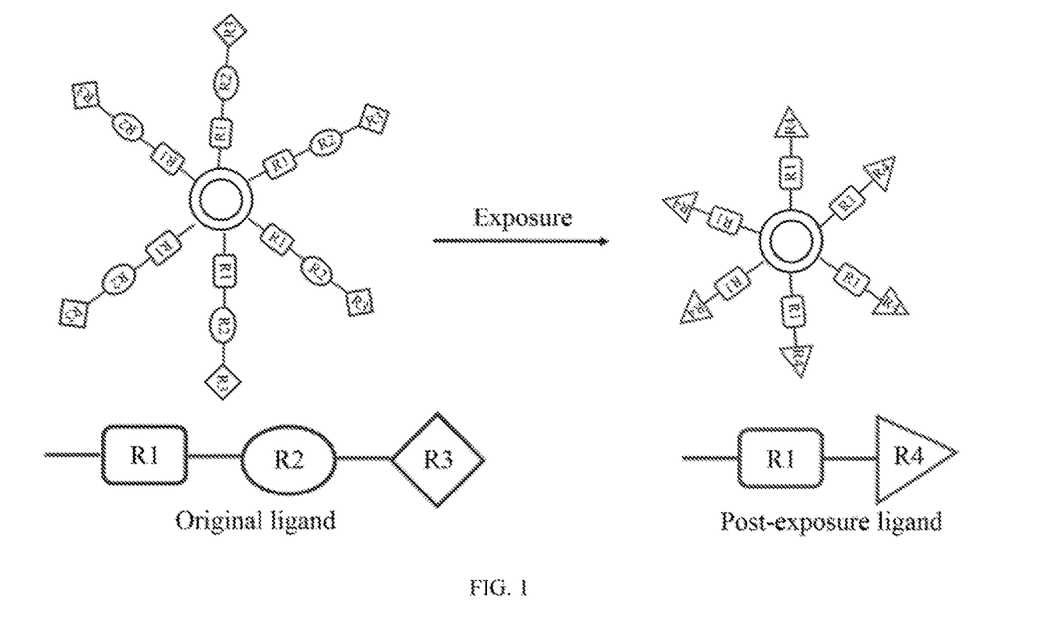
FIG. 1 is a structural schematic diagram of a quantum dot material provided by the embodiments of the present disclosure.

An quantum dot material provided by the embodiments of the present disclosure, as shown in FIG. 1, includes quantum dots and ligands linked with each of the quantum dots; wherein each of the ligands includes a coordination group R1 binding with the quantum dots and a photolysis group R2 linked with the coordination group R1, the photolysis group R2 is photolyzed under the irradiation of ultraviolet light to generate a polarity change group R4, and a polarity of the polarity change group R4 is different from a polarity of the photolysis group R2.

In the quantum dot material provided by the embodiments of the present disclosure, the photolysis group R2 modified on a surface of the quantum dot is photolyzed under the irradiation of ultraviolet light to generate the polarity change group R4, and the polarity of the polarity change group R4 is different from that of the photolysis group R2. In view of this, when preparing the patterned quantum dot film, firstly, the quantum dot film is made by using the quantum dot material with the photolysis group R2; and then a mask template is used to shield a first region of the quantum dot film, and a second region, i.e., the region not shielded by the mask template, of the quantum dot film is irradiated with ultraviolet light, so that the photolysis group R2 in the second region is photolyzed into the polarity change group R4, thereby changing the solubility of the quantum dot material in the second region; and subsequently, the quantum dot film is cleaned by using the solvent which can dissolve the quantum dot material with the photolysis group R2, the quantum dot material in the first region not irradiated, i.e., the region shielded by the mask template, is dissolved and removed, and the quantum dot material in the second region is not dissolved in the solvent, and is retained to form a pattern of the quantum dot film. When the quantum dot material is used for patterning the quantum dot film, damage to the quantum dot film caused by developing the quantum dots with an alkaline solution can be avoided.

In the quantum dot material provided by the embodiments of the present disclosure, the photolysis group R2 may be an oil-soluble group, and the polarity change group R4 may be a water-soluble group. That is, the quantum dot material with the photolysis group R2 is dissolved in an oily solvent and precipitated in an aqueous solvent, the quantum dot material with the polarity change group R4 is dissolved in the aqueous solvent and precipitated in the oily solvent, and vice versa.

In this way, when patterning the quantum dot film, a quantum dot solution formed by an oily solvent can be used to make the quantum dot film, and after the corresponding region of the quantum dot film is irradiated with ultraviolet light, the quantum dot film is cleaned with the oily solvent, so that the water-soluble group in the corresponding region is precipitated and is retained to form the pattern of the quantum dot film.

In the quantum dot material provided by the embodiments of the present disclosure, as shown in FIG. 1, the ligand R may further include a quenching group R3 linked with the photolysis group R2.

In some embodiments, the quantum dot material does not emit light after the quenching group R3 is introduced into the ligand of the quantum dot. Under the condition that the quantum dot film is patterned with the above-mentioned quantum dot material, when the corresponding region of the quantum dot film is irradiated with ultraviolet light under the shielding of the mask template, the quenching group R3 and the photolysis group R2 are delinked after the photolysis group R2 in the corresponding region is photolyzed into the polarity change group R4, that is, the quenching group R3 is separated from the quantum dot material; in this way, it is ensured that the quantum dot material in the corresponding region can emit light normally, while for the region of the quantum dot film not irradiated by ultraviolet light, because the quantum dot material contains the quenching group R3, the color mixture caused by the luminescence of the residual quantum dot material after cleaning can be avoided, and the color gamut of quantum dot displays can be improved to a large extent.

In the quantum dot material provided by the embodiments of the present disclosure, the coordination group R1 may include at least one of the following functional groups or elements which can bind with the surface of the quantum dot: amino, polyamino, hydroxyl, polyhydroxyl, sulfhydryl, polysulfhydryl, thioether, polythioether, phosphine, and phosphine oxide.

In the quantum dot material provided by the embodiments of the present disclosure, the photolysis group R2 may include at least one of the following: a carbon-oxygen double bond group, a carbon-carbon double bond group, a carbon-nitrogen double bond group and a double electron donating group.

In the quantum dot material provided by the embodiments of the present disclosure, the double electron donating group may include at least one of dimethoxy and di-secondary amino.

In the quantum dot material provided by the embodiments of the present disclosure, the quenching group R3 may include at least one of the following: CL, Br, I, $NHCOCH_3$, $NO_2$, COOH, graphene oxide, a heavy metal chelate, CSN, gold nanoparticles, cobalt complex organic matter, manganese complex organic matter and a nickel complex organic compound.

Figure 2:
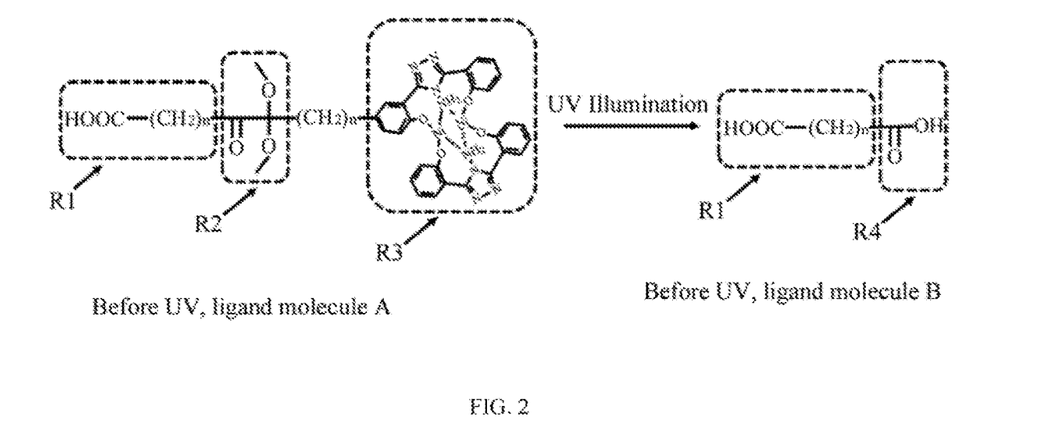
FIG. 2 is a schematic diagram of photolysis reaction of a quantum dot material provided by the embodiments of the present disclosure.
Figure 8:
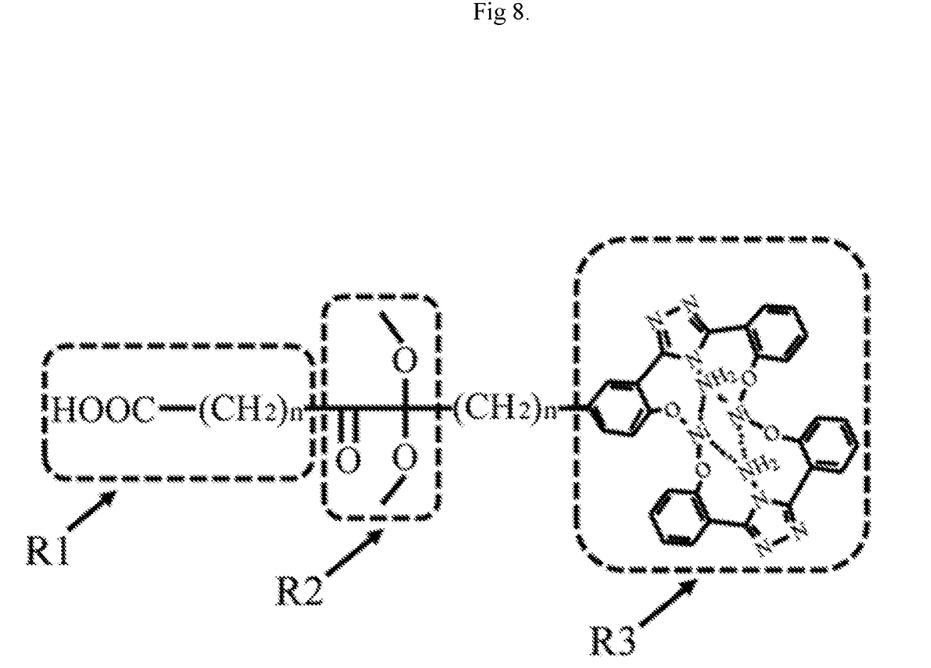
FIG. 8 is a molecular formula of the ligand not irradiated by ultraviolet light.

In the quantum dot material provided by the embodiments of the present disclosure, the molecular formula of the ligand not irradiated by ultraviolet light is depicted in FIG. 8.

Wherein the carboxyl group in the coordination group R1 binds with the quantum dot, the photolysis group R2 is a dimethoxy chain scission group, the quenching group R3 is a Ni metal chelate, and the polarity change group R4 generated by the decomposition of the photolysis group R2 after ultraviolet irradiation is a carboxyl group. The reaction formula of photolysis of the ligand under ultraviolet irradiation is shown in FIG. 2. Before ultraviolet irradiation, a ligand molecule A can be dissolved in n-octane; after photolysis, the ligand of the quantum dot material is modified from the ligand molecule A to a ligand molecule B, and the quantum dot modified by the ligand molecule B are not dissolved in n-octane; and then, a substrate can be cleaned with n-octane to form patterned quantum dots.

Optionally, in the quantum dot material provided by the embodiments of the present disclosure, the quantum dots Q are generally inorganic quantum dots. The inorganic quantum dots may be cadmium sulfide (CdS), cadmium selenide (CdSe), cadmium antimonide (CdTe), zinc selenide (ZnSe), indium phosphide (InP), lead sulfide (PbS), copper indium sulfide ($CuInS_2$), zinc oxide (ZnO), cesium lead chloride ($CsPbCl_3$), cesium lead bromide ($CsPbBr_3$), cesium lead iodide ($CsPbI_3$), cadmium sulfide/zinc sulfide (CdS/ZnS), cadmium selenide/zinc sulfide (CdSe/ZnS), zinc selenide (ZnSe), indium phosphide/zinc sulfide (InP/ZnS), lead sulfide/zinc sulfide (PbS/ZnS), indium arsenide (InAs), indium gallium arsenide (InGaAs), Indium gallium nitride (InGaN), gallium nitride (GaN), zinc telluride (ZnTe), silicon (Si), germanium (Ge), carbon (C) and other nano-scale materials with the above components, such as nanorod materials.

In some embodiments, from the perspective of environmental protection, the inorganic quantum dots may be cadmium-free quantum dots, so that the harm of heavy metal cadmium to the environment and human body can be avoided, and heavy metal pollution can be effectively avoided. Of course, the inorganic quantum dots can also be cadmium-containing quantum dots when the problem of heavy metal pollution does not need to be considered, which is not limited here.

The quantum dot material provided by embodiments of the present disclosure can be applied to the semiconductor device, the display device, the quantum dot display device, the light emitting device, the magnetic induction device and the fluorescence induction device, and the like.

Based on the same inventive concept, the embodiments of the present disclosure also provide a method for patterning a quantum dot film. Since the problem solving principle of the method is similar to that of the aforementioned quantum dot material, one can refer to the implementation of the quantum dot material for the implementation of the method, which is not repeated here.

Figure 3:
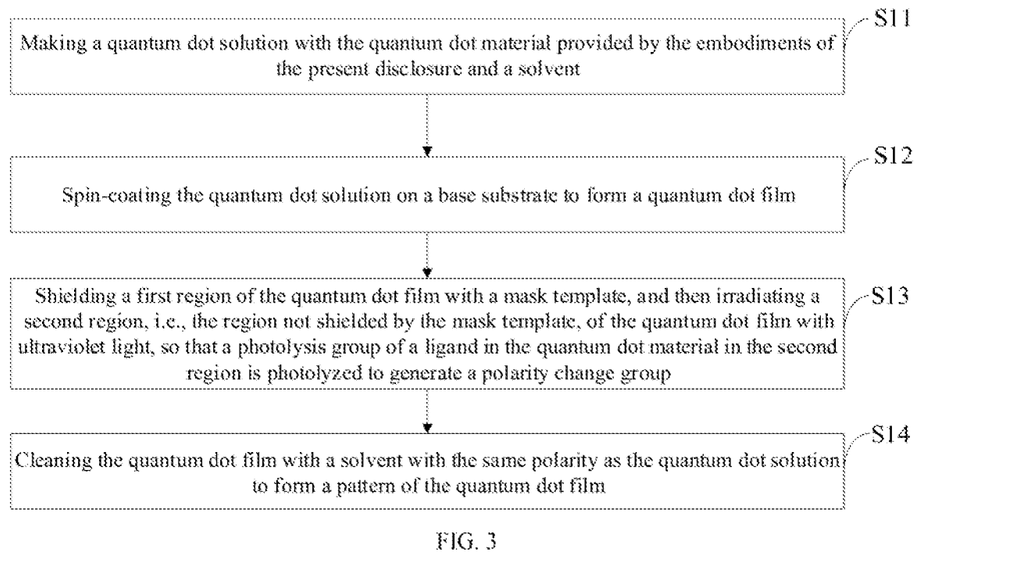
FIG. 3 is a flow chart of a method for patterning a quantum dot film provided by the embodiments of the present disclosure.

As shown in FIG. 3, the method for patterning the quantum dot film provided by the embodiments of the present disclosure includes the following steps.

S11, making a quantum dot solution with the quantum dot material provided by the above embodiments of the present disclosure and a solvent. For example, when the photolysis group R2 is an oil-soluble group, an oil-soluble solvent such as n-octane can be used to dissolve the quantum dot material to form a quantum dot solution for later use.

S12, spin-coating the quantum dot solution on a base substrate to form a quantum dot film.

S13, shielding a first region of the quantum dot film with a mask template, and then irradiating a second region, i.e., the region not shielded by the mask template, of the quantum dot film with ultraviolet light, so that a photolysis group of a ligand in the quantum dot material in the second region is photolyzed to generate a polarity change group. In some embodiments, the exposure time is adjusted according to the exposure amount per second of different exposure machines, the wavelength of the ultraviolet light for exposure is 365 nm or 436 nm, and the light intensity of the ultraviolet light is 10 mJ/cm$^2$ to 200 mJ/cm$^2$.

S14, cleaning the quantum dot film with a solvent with the same polarity as the quantum dot solution to form a pattern of the quantum dot film. In some embodiments, the quantum dot film can be cleaned with the solvent of the quantum dot solution. For example, when the photolysis group R2 is an oil-soluble group, an oil-soluble solvent such as n-octane can be used for cleaning.

Figure 4:
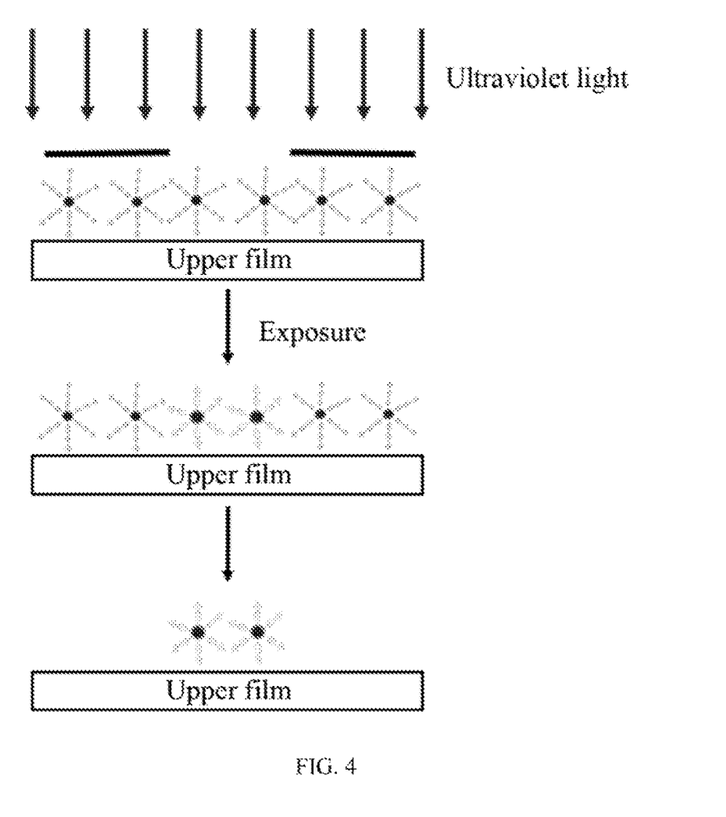
FIG. 4 is a schematic diagram of specific steps in a method for patterning a quantum dot film provided by the embodiments of the present disclosure.

In the above preparation method provided by the embodiments of the present disclosure, firstly, the quantum dot film is made by using the quantum dot material with the photolysis group R2; and then as shown in FIG. 4, a mask template is used to shield a first region of the quantum dot film, and a second region, i.e., the region not shielded by the mask template, of the quantum dot film is irradiated with ultraviolet light, so that the photolysis group R2 in the second region is photolyzed into the polarity change group R4, thereby changing the solubility of the quantum dot material in the second region; and subsequently, the quantum dot film is cleaned by using the solvent which can dissolve the quantum dot material with the photolysis group R2, the quantum dot material in the first region not irradiated, i.e., the region shielded by the mask template, is dissolved and removed, and the quantum dot material in the second region is not dissolved in the solvent, and is retained to form a pattern of the quantum dot film. When the above method for patterning the quantum dot film is adopted, damage to the quantum dot film caused by developing the quantum dots with an alkaline solution can be avoided.

Further, after the quenching group R3 is introduced into the ligand of the quantum dot, under the condition that the method for patterning the quantum dot film is adopted, when the corresponding region of the quantum dot film is irradiated with ultraviolet light under the shielding of the mask template, the quenching group R3 and the photolysis group R2 are delinked after the photolysis group R2 in the corresponding region e.g., the second region, is photolyzed into the polarity change group R4, that is, the quenching group R3 is separated from the quantum dot material; in this way, it is ensured that the quantum dot material in the corresponding region can emit light normally, while for the region of the quantum dot film not irradiated by ultraviolet light, because the quantum dot material contains the quenching group R3, the color mixture caused by the luminescence of the residual quantum dot material after cleaning can be avoided, and the color gamut of quantum dot displays can be improved to a large extent.

Figure 5:
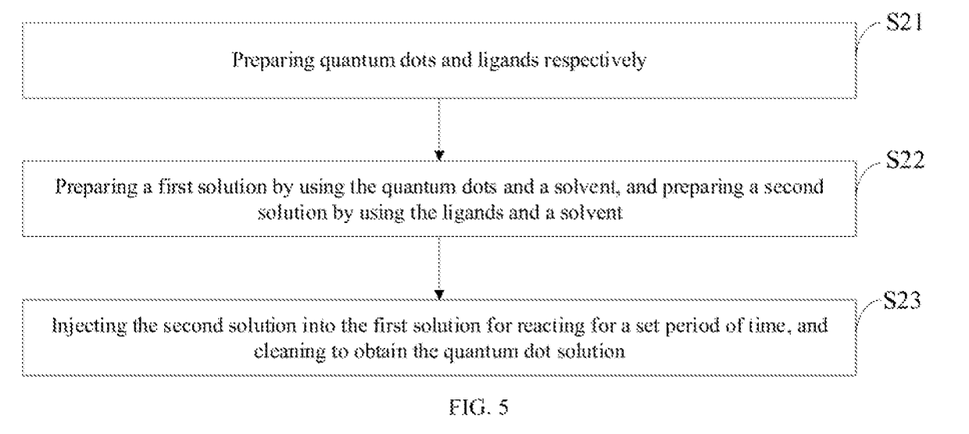
FIG. 5 is a schematic diagram of a preparing process of a quantum dot solution used in a method for patterning a quantum dot film provided by the embodiments of the present disclosure.

In the above method provided by the embodiments of the present disclosure, as shown in FIG. 5, making the quantum dot solution with the quantum dot material provided by the embodiments of the present disclosure and the matching solvent may include the following steps.

S21, preparing quantum dots and ligands respectively.

In some embodiments, the process of preparing the quantum dots may be as follows.

(A) Preparation of a CdSe core: adding 0.4 mmol of CdO, 3.2 mmol of OA and 10 mL of ODE into a 50 mL three-necked round-bottom flask, heating at 120° C., vacuumizing for 1 h, and introducing nitrogen and then raising the temperature to 240° C., so that the solution in the three-necked round-bottom flask is clear and transparent; adding 1 g of TOP and 3 g of hexadecylamine, then reducing the temperature to 150° C., vacuumizing for 30 min, introducing nitrogen, and raising the temperature to 280° C.; quickly injecting a clear solution of TOP-Se (2 mmol of Se, 2 mL of TOP and 2.5 mL of ODE are stirred in a glove box to obtain a yellow transparent solution), maintaining the temperature for 3 min, then quickly cooling to room temperature, and extracting with a methanol/chloroform solution with a volume ratio of 3:1 for many times, so that the quantum dots obtained are dispersed in chloroform for later use.

(B) Preparation of a ZnS shell precursor: adding 0.3 mmoL of Zn(Ac)$_2$, 1 mmol of DDT, 6 mL of ODE and 4 mL of OLA into a three-necked round-bottom flask, and conducting the process of stirring at 90° C., heating, vacuumizing, and nitrogen introduction for three times for later use.

(C) Shell coating: adding 2 mL of CdSe chloroform solution, 2 mL of ODE and 200 µL of OA into a three-necked round-bottom flask, conducting the process of vacuumizing at 120° C. and nitrogen replacement for three times, then raising the temperature to 240° C., and transferring the ZnS shell precursor to a main reaction system at the speed of 1.5 mL/h.

(D) Cleaning: in order to completely remove free ligands, the cleaning process is divided into three steps: (1) adding 100 mL of acetone/methanol mixed solution with a volume ratio of 7:3 into a three-necked round bottom flask filled with a quantum dot solution, magnetically stirring at 60° C. for 10 min, and centrifuging to obtain precipitate; (2) in a three-necked round-bottom flask, completely dispersing the precipitate in 20 mL of toluene, then adding 100 mL of acetone/methanol mixed solution with a volume ratio of 3:7, magnetically stirring at 60° C. for 10 min, and centrifuging to obtain precipitate; and (3) completely dispersing the precipitate in 20 mL of toluene, adding the mixture into a three-necked round-bottom flask, adding 20 mL of glacial acetic acid and 70 mL of methanol, stirring at 70° C. for 10 min, centrifuging to obtain precipitate, putting the precipitate into a vacuum drying oven for drying at 60° C., and grinding the dried precipitate into powder with a mortar for later use.

S22, preparing a first solution by using the quantum dots and a solvent, and preparing a second solution by using the ligands and a solvent.

S23, injecting the second solution into the first solution for reacting for a set period of time, and cleaning to obtain the quantum dot solution. For example, preparing 5 ml n-octane quantum dot solution of 20 mg/ml in a three-necked round-bottom flask, conducting the process of stirring at 80° C., heating, vacuumizing and nitrogen introduction for three times, then injecting 5 ml n-octane solution of ligand molecules of 60 mg/ml, reacting for 4 hours, and then repeating step (D) for cleaning to thoroughly remove free ligands and dissolving in n-octane for later use.

Figure 6A:
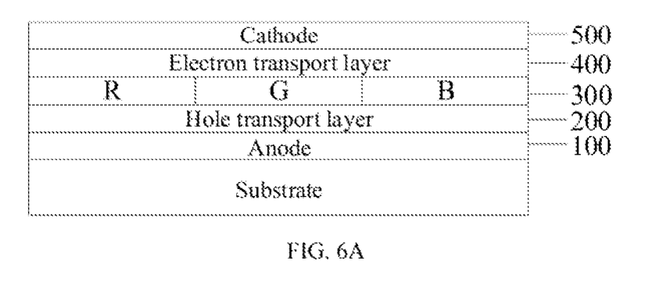
FIG. 6A is a structural schematic diagram of a quantum dot light emitting device provided by the embodiments of the present disclosure.
Figure 6B:
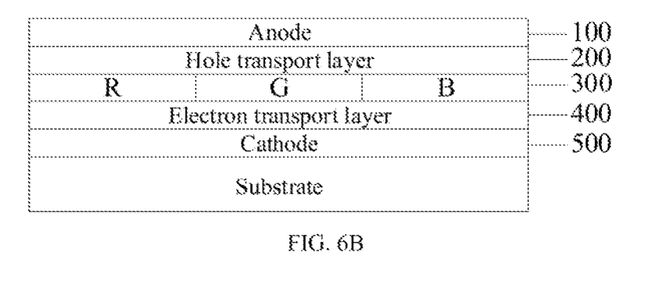
FIG. 6B is a structural schematic diagram of a quantum dot light emitting device provided by the embodiments of the present disclosure.

Based on the same inventive concept, the embodiments of the present disclosure also provide a quantum dot light emitting device, as shown in FIGS. 6A and 6B, including a cathode 500, an electron transport layer 400, a luminescent layer 300, a hole transport layer 200 and an anode 100 which are stacked sequentially; and the luminescent layer 300 includes a plurality of monochromatic quantum dot films RGB, and each quantum dot film is made by the above method provided by the embodiments of the present disclosure. That is, each of the ligands of a quantum dot material in each quantum dot film RGB includes a coordination group R1 binding with quantum dot and a polarity change group R4 linked with the coordination group R1.

FIG. 6A shows the structure of an upright device, that is, the anode 100, the hole transport layer 200, the luminescent layer 300, the electron transport layer 400 and the cathode 500 are sequentially formed on a substrate. FIG. 6B shows the structure of an inverted device, that is, the cathode 500, the electron transport layer 400, the luminescent layer 300, the hole transport layer 200 and the anode 100 are sequentially formed on the substrate. In addition, the quantum dot light emitting device provided by the embodiments of the present disclosure may also include other functional films, such as a hole injection layer, which are not described in detail here.

A process for manufacturing the quantum dot light emitting device will be described in detail below by taking the inverted device as an example. The process includes the following steps.

(1) Cleaning a substrate on which an anode layer is formed. In some embodiments, conductive glass (ITO or FTO, etc.) can be cleaned with water, isopropanol, acetone and ultrasonic waves respectively, and treated with ultraviolet irradiation for 5-10 min.

(2) Making an electron transport layer. In some embodiments, a zinc oxide nanoparticle film or zinc oxide film can be prepared on the conductive glass.

In some embodiments, a process for preparing the zinc oxide nanoparticle film includes: spin-coating zinc oxide nanoparticles, and then heating at 80° C.-120° C. to form the film. The rotating speed of a spin coater is set at 500-2500 rpm to adjust the thickness of the film. Ion doped zinc oxide nanoparticles, such as Mg, In, Al and Ga doped zinc oxide nanoparticles, can also be selected as the material of the electron transport layer.

In some embodiments, a process for preparing the zinc oxide film includes: dissolving 1 g of zinc acetate (or zinc nitrate, etc.) in 5 mL of mixed solution of ethanolamine and n-butanol, placing the conductive glass in a spin coater, dropwise adding 90-120 μL of zinc precursor solution onto the conductive glass for spin coating, and placing the conductive glass on a heating stage of 250-300° C. for heating and solvent evaporation.

Figure 7:
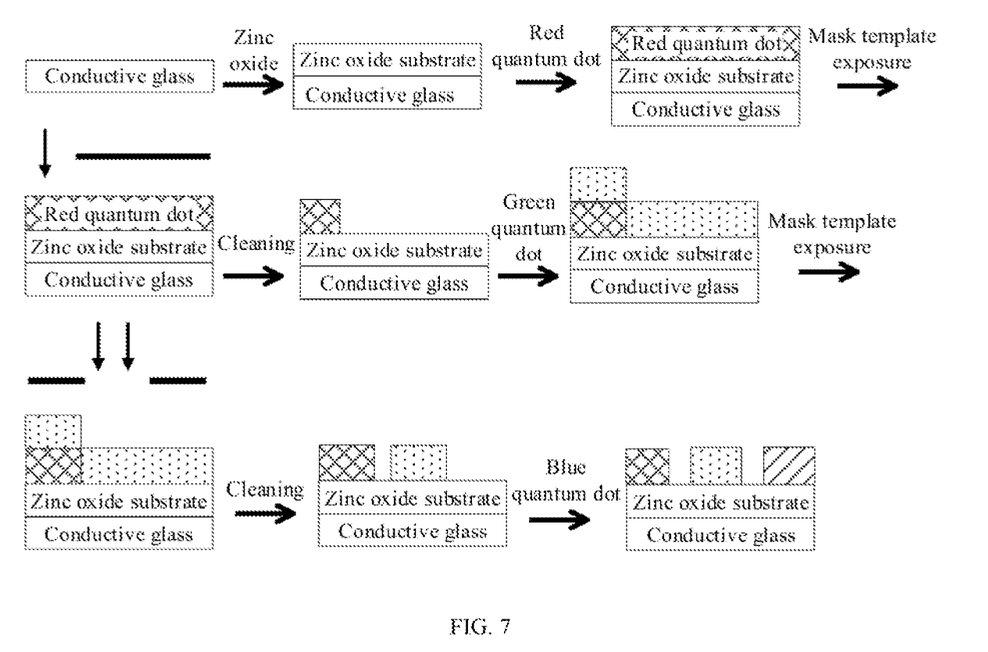
FIG. 7 is a schematic diagram of steps of preparing a luminescent layer in a quantum dot light emitting device provided by the embodiments of the present disclosure.

(3) Making a luminescent layer. In some embodiments, as shown in FIG. 7, after forming a zinc oxide substrate as the electron transport layer on the conductive glass, a red quantum dot film can be prepared by using a quantum dot material containing a photolysis group R2 through spin coating, evaporation, ink-jet printing, etc. And then a corresponding region of the red quantum dot film is irradiated with ultraviolet light under the shielding of a mask template, so that the photolysis group R2 in the corresponding region is photolyzed into a polarity change group R4, thereby changing the solubility of the red quantum dot material in the corresponding region; and subsequently, the red quantum dot film is cleaned by using a solvent which can dissolve the quantum dot material with the photolysis group R2, the red quantum dot material in non-irradiated region is dissolved and removed, and the red quantum dot material in the corresponding region is not dissolved in the solvent, and is retained to form a pattern of the red quantum dot film.

Then, a green quantum dot film is prepared by using the quantum dot material with the photolysis group R2, and then a corresponding region of the green quantum dot film is irradiated with ultraviolet light under the shielding of a mask template, so that the photolysis group R2 in the corresponding region is photolyzed into a polarity change group R4, thereby changing the solubility of the green quantum dot material in the corresponding region; and subsequently, the green quantum dot film is cleaned by using a solvent which can dissolve the quantum dot material with the photolysis group R2, the green quantum dot material in non-irradiated regions is dissolved and removed, and the green quantum dot material in the corresponding region is not dissolved in the solvent, and is retained to form a pattern of the green quantum dot film.

The above steps are repeated to obtain a pattern of a blue quantum dot film.

When the ligand of the quantum dot material contains a quenching group R3, the red quantum dot material remaining under a pattern of the green quantum dot film does not emit light because of the quenching group R3, and the red quantum dot material and green quantum dot material remaining under the pattern of the blue quantum dot film do not emit light because of the quenching group R3, which can prevent the color mixture caused by the luminescence of the residual quantum dot material after cleaning, and improve the color gamut of quantum dot displays to a large extent.

(4) Making a hole transport layer. In some embodiments, the hole transport layer may be prepared on the conductive glass through spin coating, evaporation, ink-jet printing, etc.

(5) Making a hole injection layer. In some embodiments, the hole injection layer may be prepared on the conductive glass through spin coating, evaporation, ink-jet printing, etc. PEDOT:PSS 4083 (poly 3,4-ethylenedioxythiophene/polystyrene sulfonate) or other compounds may be used to make the hole injection layer. The film forming temperature of PEDOT is 130° C.-150° C., and the rotating speed of a spin coater is set at 500-2500 rpm to adjust the thickness of the film.

(6) Making a cathode. In some embodiments, the cathode may be formed through the evaporation of an Al film or sputtering of an IZO film.

(7) Packaging. Under ultraviolet excitation, the quantum dot light emitting device is packaged by adding a packaging cover plate and introducing an ultraviolet curing adhesive.

Based on the same inventive concept, the embodiments of the present disclosure also provide a display device, including the above quantum dot light emitting device provided by the embodiments of the present disclosure. The display device may be any product or component with a display function, such as a mobile phone, a tablet computer, a television, a display, a notebook computer, a digital photo frame and a navigator. One can refer to the embodiments of the quantum dot light emitting device described above for the implementation of the display device, which will not be repeated here.

According to the quantum dot material, the method for patterning the quantum dot film, the quantum dot light emitting device and the display device provided by the embodiments of the present disclosure, the photolysis group modified on the surface of the quantum dot is photolyzed under the irradiation of ultraviolet light to generate the polarity change group, and the polarity of the polarity change group is different from that of the photolysis group; in view of this, when preparing the patterned quantum dot film, the quantum dot film is first made by using the quantum dot material with the photolysis group, and then the corresponding region of the quantum dot film is irradiated with ultraviolet light under the shielding of the mask template, so that the photolysis group in the corresponding region is photolyzed into the polarity change group, thereby changing the solubility of the quantum dot material in the corresponding region; and subsequently, the quantum dot film is cleaned by using the solvent which can dissolve the quantum dot material with the photolysis group, the quantum dot material in non-irradiated regions is dissolved and removed, and the quantum dot material in the corresponding region is not dissolved in the solvent, and is retained to form a pattern of the quantum dot film. When the quantum dot material is used for patterning the quantum dot film, damage to the quantum dot film caused by developing the quantum dots with an alkaline solution can be avoided.

Obviously, those skilled in the art can make various changes and variations to the present disclosure without departing from the spirit and scope of the present disclosure. Thus, if these modifications and variations of the present disclosure fall within the scope of the claims of the present disclosure and their equivalents, the present disclosure is also intended to include these changes and variations.

What is claimed is:

1. A quantum dot material, comprising quantum dots and ligands linked with each of the quantum dots; wherein
   each of the ligands comprises a coordination group binding with the quantum dot and a photolysis group linked with the coordination group, the photolysis group is photolyzed under the irradiation of ultraviolet light to generate a polarity change group, and a polarity of the polarity change group is different from a polarity of the photolysis group.

2. The quantum dot material according to claim 1, wherein the photolysis group is an oil-soluble group, and the polarity change group is a water-soluble group;
   or the photolysis group is an water-soluble group, and the polarity change group is an oil-soluble group.

3. The quantum dot material according to claim 2, wherein the oil-soluble group comprises at least one of the following: a carbon-oxygen double bond group, a carbon-carbon double bond group, a carbon-nitrogen double bond group and a double electron donating group.

4. The quantum dot material according to claim 3, wherein the double electron donating group comprises at least one of dimethoxy and di-secondary amino.

5. A method for patterning a quantum dot film, comprising:
   making a quantum dot solution with the quantum dot material according to claim 1 and a solvent;
   forming a quantum dot film by spin-coating the quantum dot solution on a base substrate;
   shielding a first region of the quantum dot film with a mask template;
   generating a polarity change group by irradiating a second region of the quantum dot film with ultraviolet light to cause that photolysis groups of ligands in a quantum dot material in the second region is photolyzed; wherein the second region is an region of the quantum dot film not shielded by the mask template; and
   forming a pattern of the quantum dot film by cleaning the quantum dot film with a solvent with a same polarity as the quantum dot solution.

6. A quantum dot light emitting device, comprising:
   a cathode, an electron transport layer, a luminescent layer, a hole transport layer and an anode which are stacked sequentially; wherein the luminescent layer comprises a plurality of monochromatic quantum dot films, and each of the quantum dot films is made by the method according to claim 5.

7. The quantum dot light emitting device according to claim 5, wherein:
   the cathode is between the electron transport layer and a substrate; or
   the anode is between the hole transport layer and a substrate.

8. The method according to claim 5, wherein the making the quantum dot solution with the quantum dot material according to claim 1 and the solvent comprises:
   preparing the quantum dots and the ligands respectively;
   preparing a first solution by using the quantum dots and the solvent, and preparing a second solution by using the ligand and the solvent; and
   injecting the second solution into the first solution for reacting for a set period of time, and cleaning to obtain the quantum dot solution.

9. The method according to claim 5, wherein:
   a wavelength of the ultraviolet light is 365 nm or 436 nm, and a light intensity of the ultraviolet light is 10 mJ/cm$^2$ to 200 mJ/cm$^2$.

10. The method according to claim 5, wherein the cleaning the quantum dot film with the solvent with the same polarity as the quantum dot solution comprises:
    cleaning the quantum dot film with a solvent that is the same with the solvent in the quantum dot solution.

11. A display device, comprising the quantum dot light emitting device according to claim 6.

12. The quantum dot material according to claim 1, wherein the ligand further comprises a quenching group linked with the photolysis group.

13. The quantum dot material according to claim 12, wherein the quenching group comprises at least one of the following: CL, Br, I, NHCOCH$_3$, NO$_2$, COOH, graphene oxide, a heavy metal chelate, CSN, gold nanoparticles, cobalt complex organic matter, manganese complex organic matter and a nickel complex organic compound.

14. The quantum dot material according to claim 1, wherein the quantum dot is an inorganic quantum dot.

15. The quantum dot material according to claim 14, wherein the inorganic quantum dot is made of one or more of the following nano-scale materials:
    CdS, CdSe, CdTe, ZnSe, InP, PbS, CuInS$_2$, ZnO, CsPbCl$_3$, CsPbBr$_3$, CsPbI$_3$, CdS/ZnS, CdSe/ZnS, ZnSe, InP/ZnS, PbS/ZnS, InAs, InGaAs, InGaN, GaN, ZnTe, Si, Ge, C.

16. The quantum dot material according to claim 1, wherein the coordination group comprises at least one of the following: amino, polyamino, hydroxyl, polyhydroxyl, sulfhydryl, polysulfhydryl, thioether, polythioether, phosphine, and phosphine oxide.

\* \* \* \* \*